United States Patent
Levy et al.

(10) Patent No.: US 9,423,961 B2
(45) Date of Patent: Aug. 23, 2016

(54) METHOD TO ENHANCE PROGRAMMING PERFORMANCE IN MULTILEVEL NVM DEVICES

(71) Applicant: Apple Inc., Cupertino, CA (US)

(72) Inventors: Atai Levy, Ra'anana (IL); Yoav Kasorla, Kfar Netar (IL); Stas Mouler, Kfar Saba (IL); Alex Borisenkov, Herzliya (IL); Dmitry Koyfman, Modi'in-Maccabim-Re'ut (IL)

(73) Assignee: Apple Inc., Cupertino, CA (US)

( * ) Notice: Subject to any disclaimer, the term of this patent is extended or adjusted under 35 U.S.C. 154(b) by 202 days.

(21) Appl. No.: 14/479,732

(22) Filed: Sep. 8, 2014

(65) Prior Publication Data
US 2016/0070473 A1    Mar. 10, 2016

(51) Int. Cl.
G06F 3/00 (2006.01)
G06F 3/06 (2006.01)
G06F 13/16 (2006.01)
G11C 11/56 (2006.01)
G11C 16/10 (2006.01)

(52) U.S. Cl.
CPC .............. *G06F 3/0604* (2013.01); *G06F 3/061* (2013.01); *G06F 3/0632* (2013.01); *G06F 3/0659* (2013.01); *G06F 3/0679* (2013.01); *G06F 13/1689* (2013.01); *G11C 11/5628* (2013.01); *G11C 16/10* (2013.01)

(58) Field of Classification Search
None
See application file for complete search history.

(56) References Cited

U.S. PATENT DOCUMENTS

| | | | | |
|---|---|---|---|---|
| 6,061,504 A | * | 5/2000 | Tzelnic | G06F 11/1464 348/E5.008 |
| 6,199,178 B1 | * | 3/2001 | Schneider | G06F 11/1435 714/21 |
| 6,526,484 B1 | * | 2/2003 | Stacovsky | G06F 13/1626 710/39 |
| 6,874,144 B1 | * | 3/2005 | Kush | G06F 9/524 718/100 |
| 7,023,739 B2 | | 4/2006 | Chen et al. | |
| 7,340,581 B2 | * | 3/2008 | Gorobets | G06F 3/0613 365/185.33 |
| 7,360,137 B2 | | 4/2008 | Amidon et al. | |
| 7,701,773 B2 | | 4/2010 | Nakagawa et al. | |
| 7,839,687 B2 | | 11/2010 | Dutta et al. | |

(Continued)

FOREIGN PATENT DOCUMENTS

EP    0376285    7/1990
IT    WO 2010143209 A1 * 12/2010    ........... G11C 16/102

(Continued)

OTHER PUBLICATIONS

International Search Report and Written Opinion in application No. PCT/US2015/045165 issued Oct. 23, 2015, 9 pages.

*Primary Examiner* — Charles Rones
*Assistant Examiner* — Matthew Chrzanowski
(74) *Attorney, Agent, or Firm* — Meyertons, Hood, Kivlin, Kowert & Goetzel, P.C.

(57) ABSTRACT

An apparatus includes an interface and a processor. The interface is configured to communicate with a memory device. The processor is configured to send to the memory device, via the interface, a sequence of write commands that program multiple types of memory pages that incur respective different programming durations in the memory device, while inserting in the sequence suspension periods for permitting execution of storage commands that are not part of the sequence, such that at least some of the suspension periods are followed by write commands of types that do not have a shortest programming duration among the programming durations.

18 Claims, 4 Drawing Sheets

(56) References Cited

U.S. PATENT DOCUMENTS

| | | | |
|---|---|---|---|
| 8,379,450 B2 | 2/2013 | Kim | |
| 8,555,000 B2 | 10/2013 | Jo et al. | |
| 8,619,493 B2 | 12/2013 | Kim | |
| 8,634,247 B1 | 1/2014 | Sprouse et al. | |
| 8,638,585 B2 | 1/2014 | Lee et al. | |
| 8,717,827 B1* | 5/2014 | Mehnert | G11C 11/5628 365/185.11 |
| 8,738,860 B1* | 5/2014 | Griffin | G06F 12/0897 711/122 |
| 2003/0126375 A1* | 7/2003 | Hill | G06F 12/0808 711/145 |
| 2003/0126379 A1* | 7/2003 | Kaushik | G06F 9/3009 711/150 |
| 2004/0073766 A1* | 4/2004 | Arimilli | G06F 12/1433 711/202 |
| 2005/0055517 A1* | 3/2005 | Olds | G06F 3/0601 711/158 |
| 2005/0071841 A1* | 3/2005 | Hoflehner | G06F 8/441 718/100 |
| 2005/0172087 A1* | 8/2005 | Klingman | G06F 9/4843 711/154 |
| 2006/0004955 A1* | 1/2006 | Ware | G11C 11/406 711/106 |
| 2008/0162853 A1 | 7/2008 | Bang et al. | |
| 2009/0037927 A1* | 2/2009 | Sangili | G06F 9/485 718/108 |
| 2009/0083744 A1* | 3/2009 | Shimada | G06F 9/4843 718/102 |
| 2012/0011301 A1 | 1/2012 | Goss et al. | |
| 2012/0065953 A1* | 3/2012 | Tamiya | G06F 17/5022 703/13 |
| 2012/0066439 A1 | 3/2012 | Fillingim | |
| 2012/0173792 A1 | 7/2012 | Lassa et al. | |
| 2013/0024611 A1 | 1/2013 | Bar-Or et al. | |
| 2013/0212315 A1 | 8/2013 | Steiner et al. | |
| 2013/0227198 A1 | 8/2013 | Lee | |
| 2013/0229868 A1* | 9/2013 | Koh | G11C 11/5628 365/185.03 |
| 2013/0254454 A1 | 9/2013 | Ide et al. | |
| 2013/0265825 A1 | 10/2013 | Lassa | |
| 2014/0006688 A1 | 1/2014 | Yu et al. | |
| 2014/0019705 A1 | 1/2014 | Pyeon et al. | |
| 2014/0068296 A1 | 3/2014 | Byom et al. | |
| 2014/0108714 A1 | 4/2014 | Lee et al. | |
| 2015/0186292 A1* | 7/2015 | Sundaram | G06F 12/1045 711/207 |
| 2015/0286586 A1* | 10/2015 | Yadav | G06F 9/528 711/152 |
| 2015/0331633 A1* | 11/2015 | Yang | G06F 17/30902 711/119 |

FOREIGN PATENT DOCUMENTS

| | | | |
|---|---|---|---|
| JP | 0376285 A2 * | 7/1990 | G11C 16/08 |
| WO | 2010/143209 | 12/2012 | |
| WO | 2014/066843 | 5/2014 | |
| WO | WO 2014066843 A1 * | 5/2014 | G06F 9/30047 |

* cited by examiner

METHOD TO ENHANCE PROGRAMMING PERFORMANCE IN MULTILEVEL NVM DEVICES

TECHNICAL FIELD

The present disclosure relates generally to memory devices, and particularly to methods and systems for enhancing programming performance in memory devices.

BACKGROUND

Multi-level Non-Volatile Memory (NVM) devices require fast programming. Examples of prior art techniques are provided below.

U.S. Patent Application Publication 2012/0011301, whose disclosure is incorporated herein by reference, describes techniques for adjusting the timing of operations for a storage device. According to one aspect of the disclosure, a method includes receiving, with at least one device, a workload indicator. The method further includes adjusting, with the at least one device, an operation execution time for the storage device responsive to at least the workload indicator.

U.S. Patent Application Publication 2013/0254454, whose disclosure is incorporated herein by reference, describes a memory system and bank interleaving method. A memory system includes a plurality of memory chips configuring banks, an instruction generator, and a memory controller. The instruction generator generates a plurality of instructions. The memory controller is configured to execute memory accesses to the banks based on the instructions. Each memory access comprises a first command sequence and a second command sequence. The first command sequence causes in-bank processing shortly subsequent to the first command. The second command sequence is executed subsequent to the in-bank processing. The memory controller executes successively a second command sequence to a first bank based on a first instruction and a first command sequence to the first bank based on a second instruction subsequent to the first instruction, and then starts a memory access to a second bank based on a third instruction while the first bank is executing the in-bank processing caused by the first command sequence.

U.S. Patent Application Publication 2013/0265825, whose disclosure is incorporated herein by reference, describes a system and method for micro-tiering in non-volatile memory. In a storage device such as a solid state disk (SSD), a central controller communicates with a plurality of multi-chip memory packages (MCP). Each multi-chip memory package comprises a plurality of memory dies and a local processor, wherein the plurality of memory dies includes different memory tiers. The central controller may handle management of the virtual address space while the local processor in each MCP manages the storage of data within memory tiers in the memory dies of its respective MCP.

SUMMARY

An embodiment that is described herein provides an apparatus including an interface and a processor. The interface is configured to communicate with a memory device. The processor is configured to send to the memory device, via the interface, a sequence of write commands that program multiple types of memory pages that incur respective different programming durations in the memory device, while inserting in the sequence suspension periods for permitting execution of storage commands that are not part of the sequence, such that at least some of the suspension periods are followed by write commands of types that do not have a shortest programming duration among the programming durations.

In some embodiments, the processor is configured to execute, during the suspension periods, at least one storage command that is not part of the sequence. In an embodiment, the interface is configured to communicate with one or more additional memory devices, and the processor is configured to execute the storage command that is not part of the sequence in the additional memory devices. In a disclosed embodiment, the storage command that is not part of the sequence includes a read command.

In another embodiment, the multiple types include a Least Significant Bit (LSB) page type and at least one additional page type, and the processor is configured to insert at least some of the suspension periods before write commands of the additional page type. In yet another embodiment, the processor is configured to send the write commands in a cache programming mode.

There is additionally provided, in accordance with an embodiment that is described herein, a method including sending to a memory device a sequence of write commands that program multiple types of memory pages that incur respective different programming durations in the memory device. Suspension periods are inserted in the sequence, for permitting execution of storage commands that are not part of the sequence, such that at least some of the suspension periods are followed by write commands of types that do not have a shortest programming duration among the programming durations.

There is also provided, in accordance with an embodiment that is described herein, an apparatus including a memory device and a processor. The processor is configured to send to the memory device, via the interface, a sequence of write commands that program multiple types of memory pages that incur respective different programming durations in the memory device, while inserting in the sequence suspension periods for permitting execution of storage commands that are not part of the sequence, such that at least some of the suspension periods are followed by write commands of types that do not have a shortest programming duration among the programming durations.

The present disclosure will be more fully understood from the following detailed description of the embodiments thereof, taken together with the drawings in which:

DETAILED DESCRIPTION OF EMBODIMENTS

Overview

Figure 1:
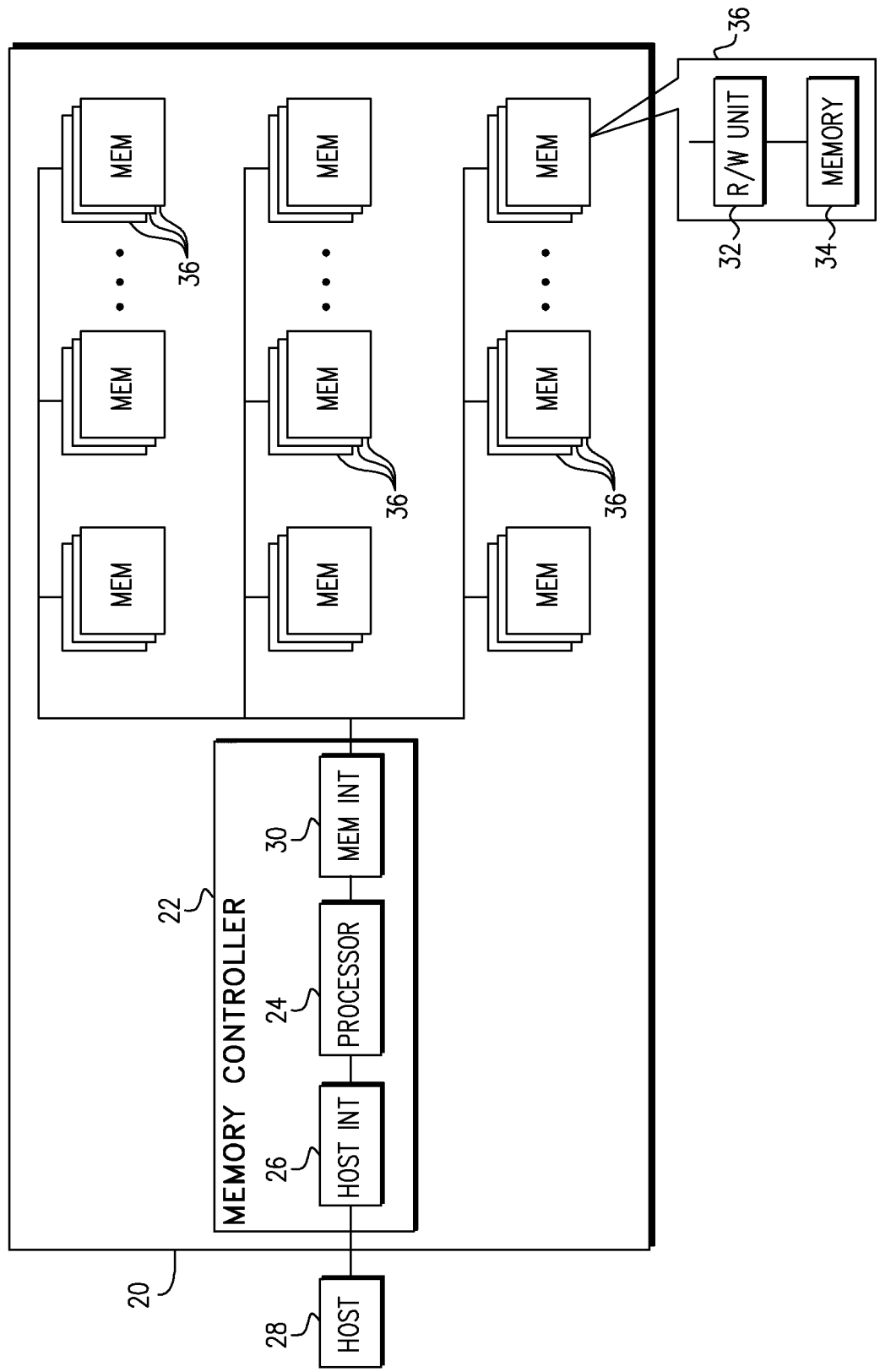
FIG. 1 is a block diagram that schematically illustrates a memory system, in accordance with an embodiment that is described herein.

Multi-level cell (MLC) Non Volatile Memory (NVM) devices require high storage capacity and high operational speed. During programming, a memory controller typically sends input/output (IO) data (e.g., a page) to each die, and a read/write (R/W) unit in each die programs the page into a memory array of the die. (The terms "die" and "device" are used interchangeably herein.)

MLC devices can store multiple types of pages on each word line of the memory array. For example, one word line of a Triple-Level Cell (TLC) device can store up to three types of pages. Each page is stored separately as an IO from the controller to the R/W unit, and is later programmed from the R/W unit to the memory of the die. Typically, but not necessarily, some page types take longer to program, as in the case of three page types, where the first page type is programmed at the shortest duration and the third page type incurs the longest duration.

Embodiments that are described hereinbelow provide improved methods and systems to enhance storage performance of a system comprising a group of MLC NVM devices.

In some embodiments, when sending a sequence of write commands to a given memory device, the memory controller inserts suspension periods in the sequence, to allow execution of commands that are not in part of the sequence. Such commands may comprise, for example, read commands that would otherwise remain pending until the sequence of write command is completed, or commands to other memory devices. In the disclosed embodiments, the memory controller chooses to insert at least some the suspension periods before write commands that are not of the shortest programming durations.

For example, when sending a sequence of Least Significance Bit (LSB) pages (having a relatively short programming duration) and Most Significant Bit (MSB) pages (having a longer programming duration), the memory controller inserts at least some of the suspension periods before MSB pages. In this manner, programming utilization of the system is improved.

In an example embodiment, the system uses a cache write mode, in which the memory device comprises a buffer to store the next IO during programming the current IO, to enable continuous page-by-page programming in the R/W unit. When programming multiple memory devices (e.g., dies), the memory controller inserts a suspension period before a first page which takes a long time to program. The long programming operation allows the controller to complete sending IOs to all dies, and to return to the first die before the R/W unit completes the programming of the first page. While the R/W unit programs the first page, the controller stores a second page in the buffer of the memory device. As soon as the R/W unit completes programming the first page, it may start programming the second page.

In other embodiments, if the storage capacity of the internal buffer is big enough to store more than a single page, the controller may select multiple pages that require long programming durations, and thus enable cache mode for multiple pages continuously.

In alternative embodiments, the controller may select the locations of programming suspensions according to the size of the buffer, the duration of the IOs and the programming duration per page. Such sequencing enables shortening the total programming duration, as will be apparent to those skilled in the art, after reading the present description.

System Description

FIG. 1 is a block diagram that schematically illustrates a multi-device memory system 20, in accordance with an embodiment that is described herein. System 20 accepts data for storage from a host 28 and stores it in memory, and retrieves data from memory and provides it to the host. In the present example, system 20 comprises a Solid-State Disk (SSD) that stores data for a host computer. In alternative embodiments, however, system 20 may be used in any other suitable application and with any other suitable host, such as in computing devices, mobile phones or other communication terminals, removable memory modules such as Disk-On-Key (DOK) devices, Secure Digital (SD) cards, Multi-Media Cards (MMC) and embedded MMC (eMMC), digital cameras, music and other media players and/or any other system or device in which data is stored and retrieved.

System 20 comprises multiple memory devices 36, each comprising multiple analog memory cells. In the present example, devices 36 comprise non-volatile NAND Flash devices, although any other suitable memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM) and/or magnetic RAM (MRAM), can also be used. The disclosed techniques are applicable in various two-dimensional and three-dimensional memory device configurations.

In the context of the present patent application and in the claims, the term, "analog memory cell" is used to describe any non-volatile memory (NVM) cell that holds a continuous, analog value of a physical parameter, such as an electrical voltage or charge. Any suitable type of analog memory cells, such as the types listed above, can be used. In the present example, each memory device 36 comprises a NVM of NAND Flash cells. The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell multi-level cell (MLC) can be programmed to assume one of four possible programming levels by writing one of four possible nominal storage values into the cell. Alternatively, a 3 bit/cell triple-level cell (TLC) can be programmed to assume one of eight possible programming levels by writing one of eight possible nominal storage values into the cell.

The memory cells are typically arranged in rows and columns. Typically, a given memory device comprises multiple erasure blocks (also referred to as memory blocks), e.g., groups of memory cells that are erased together. Data typically cannot be reprogrammed in-place, and memory blocks are therefore erased before being programmed with other data. Each memory block comprises multiple memory pages. Typically, but not necessarily, each page is stored in a word line. In a TLC device, each word line is configured to store up to three pages.

MLC NVM devices are often grouped together in a Multi-Chip Package (MCP) or other structures. The term "NVM device" may refer to unpackaged dies, packaged memory devices, or any other suitable kind of a memory unit. A typical SSD may comprise a number of 4 GB, 8 GB or higher capacity memory devices. Generally, however, system 20 may comprise any suitable number of memory devices of any desired type and size.

System 20 comprises a memory controller 22, which accepts data from host 28 and stores it in memory devices 36, and retrieves data from the memory devices and provides it to the host. Memory controller 22 comprises a host interface 26 for communicating with host 28, a memory interface 30 for communicating with memory devices 36, and a processor 24 that processes the stored and retrieved data. Each device 36 comprises a read/write (R/W) unit 32, which is configured to program the data sent from memory controller 22, into memory 34.

The functions of processor 24 can be implemented, for example, using software running on a suitable Central Processing Unit (CPU), using hardware (e.g., state machine or other logic), or using a combination of software and hardware elements.

Memory controller 22, and in particular processor 24, may be implemented in hardware. Alternatively, the memory controller may comprise a microprocessor that runs suitable software, or a combination of hardware and software elements. In some embodiments, processor 24 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The system configuration of FIG. 1 is an example configuration, which is shown purely for the sake of conceptual clarity. Any other suitable memory system configuration can also be used. Elements that are not necessary for understanding the principles of the present disclosure, such as various interfaces, addressing circuits, timing and sequencing circuits and debugging circuits, have been omitted from the figure for clarity.

In the exemplary system configuration shown in FIG. 1, memory devices 36 and memory controller 22 are implemented as separate Integrated Circuits (ICs). In alternative embodiments, however, the memory devices and the memory controller may be integrated on separate semiconductor dies in a single Multi-Chip Package (MCP), or a Multi-Chip Module (MCM) or System on Chip (SoC), and may be interconnected by an internal bus. Further alternatively, some or all of the memory controller circuitry may reside on the same die on which one or more of the memory devices are disposed.

Further alternatively, some or all of the functionality of memory controller 22 can be implemented in software and carried out by a processor or other element of the host system, or by any other type of memory controller. In some embodiments, host 28 and Memory controller 22 may be fabricated on the same die, or on separate dies in the same device package.

Figure 2:
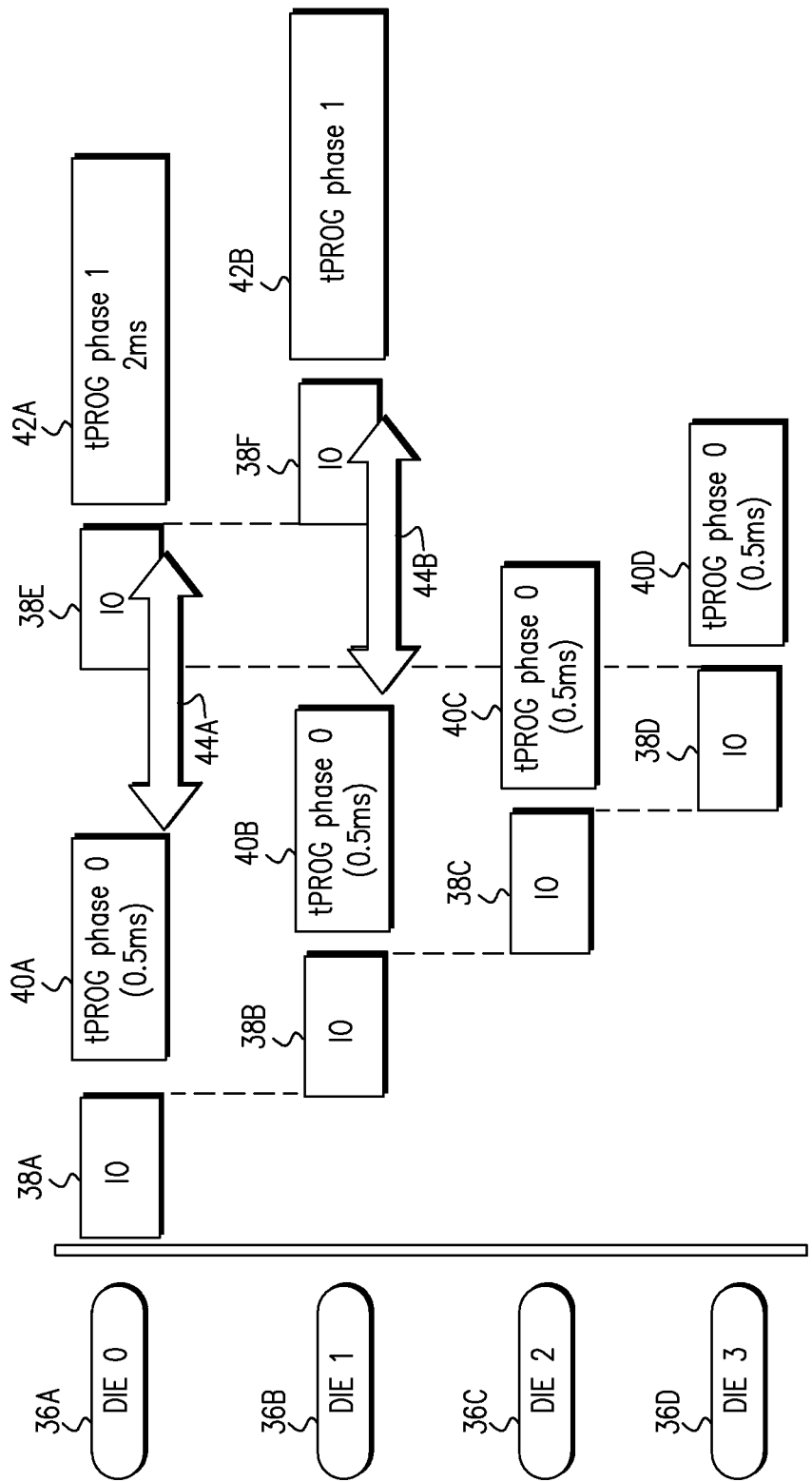
FIGS. 2 and 3 are timing diagrams that schematically illustrate programming time schemes of four memory dies, in accordance with an embodiment that is described herein.
Figure 3:
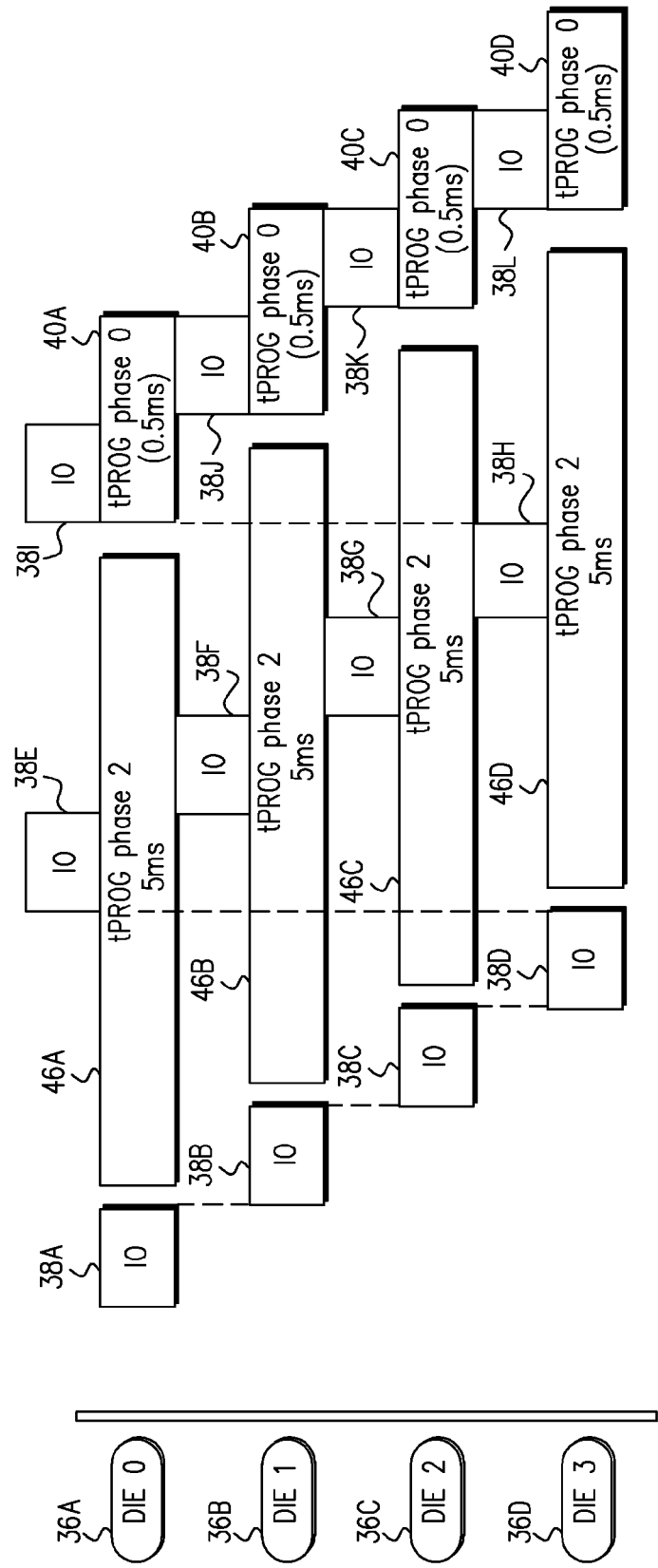
Figure 4:
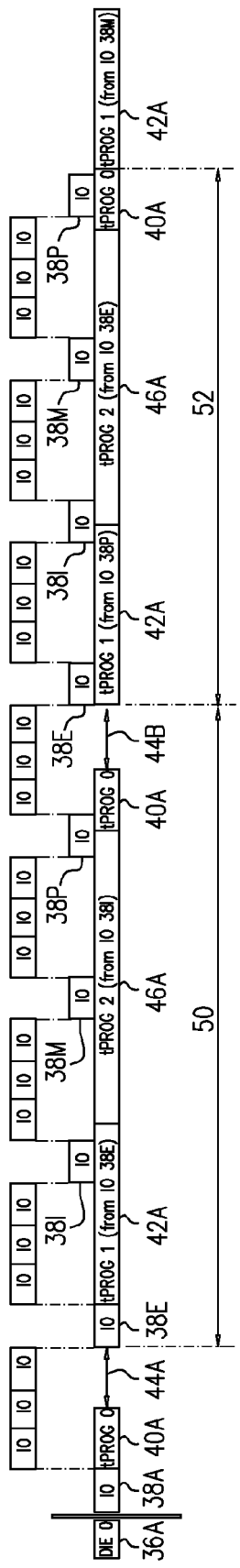
FIG. 4 is a timing diagram that schematically illustrates programming cycles of a Triple-Level Cell (TLC) memory device, in accordance with an embodiment that is described herein.

Devices 36 are differentiated as necessary by appending a letter to the identifying numeral, so that, for example, devices 36A-36D in FIGS. 2-4 are substantially similar to device 36 in FIG. 1.

FIG. 2 is a timing diagram that schematically illustrates programming time schemes of four memory devices 36A-36D, in accordance with an embodiment that is described herein. The terms "device" and "die" are used interchangeably in the present patent application.

The time scheme in FIG. 2 comprises Input-Output (IO) times, generically referred to herein as IO 38, which are the storing and reading durations of the communication between controller 22 and devices 36A-36D. For example, IOs 38A and 38E refer to IOs between controller 22 and die 0 36A, and IO 38B refers to an IO between controller 22 and die 1 36B. In the present example the IO duration is constant, (typically 0.4 milliseconds). Accordingly, IO 38A is equal to IO 38B and to all other IOs in the present figures. In alternative embodiments, the IO duration may be variable due to a different configuration or different settings of devices 36.

Typically the operation of controller 22 is sequential, the controller sending a command to initiate an IO to a first die. Only when the IO to the first die is completed does the controller start sending a second command to a second die, initiating an IO to the die. Controller 22 typically does not send commands causing two IOs to occur in parallel. When a die receives a command initiating an IO, it may begin communicating with the controller, its R/W unit 32 programming data into its analog memory 34 during the IO.

Furthermore, the time scheme in FIG. 2 illustrates programming durations of R/W units 32 writing into memories 34. The programming durations are denoted tProg and are typically initiated after the page is stored in a buffer of the memory device. As necessary, tProg durations may be differentiated as described below.

A TLC device stores three bits per cell, and thus, three pages are stored in each word line. The tProg duration may be different from page to page, for example, the programming duration of the first page in a given word line is typically shorter compared to the programming duration of the second page in the same word line. In the disclosed techniques the programming duration of the same page (e.g., first page) is assumed to be substantially identical for all devices 36 (e.g., die 0-die 3).

For example, the programming duration of the first page is typically 0.5 millisecond (ms) and is labeled "tProg phase 0" (or in short "tP0"). The programming duration of the second page, labeled "tProg phase 1" ("tP1"), is typically 2 ms, and the programming duration of the third page, labeled "tProg phase 2" ("tP2"), is the longest, and typically lasts 5 ms.

The programming sequence of Controller 22 starts with a command initiating IO 38A sent to die 36A, followed by a command initiating IO 38B sent to die 36B immediately after IO 38A is completed. This completion is indicated by a vertical dashed line marking the end of IO 38A and the beginning of IO 38B. After sending IO 38B, controller 22 continues to IO 38C, and then to IO 38D.

The data sent during IO 38A comprises a first page (tP0), which R/W unit 32A programs, during tP0 40A, into memory 34 of die 36A. In parallel with tP0 40A, after completion of IO 38A, controller 22 sends a command initiating IO 38B to die 36B. After a command initiating IO 38B is sent to die 36B, the R/W unit programs the page during tP0 40B into memory 34. Equally, controller 22 sends commands initiating IO 38C followed by IO 38D to respective dies 36C and 36D, and the corresponding R/W unit of each die programs the pages during tP0 40C and tP0 40D to the respective dies 36C and 36D.

After controller 22 completes IO 38D, it can send a second page during IO 38E to die 36A, and R/W unit 32A is able to program the page during tP1 42A into memory 34A. As a result, memory 34A of die 36A is not programmed between the end of tP0 40A and the beginning of tP1 42A. This duration is denoted suspension period 44A. A similar phenomenon repeats in all four dies, and is marked, for example, in die 36B as suspension period 44B.

In general, a suspension period occurs when the tP0 duration is shorter than the IO duration multiplied by the number of programmed dies (four in the present example). In the example illustrated, suspension period 44A is calculated by subtracting the duration of tP0 (0.5 ms) from the total duration of four IOs (1.6 ms), and thus suspension period 44A equals 1.1 ms. All the above durations are examples and may change to any suitable durations in other examples.

In some embodiments, the disclosed techniques reduce the time of suspension period 44A (and other suspension periods in the programming process), by planning the sequence of the tPROG phases with respect to the IO duration and to the number of programmed dies.

FIG. 3 is a timing diagram that schematically illustrates optimized programming time schemes of four memory devices 36A-36D, in accordance with an embodiment that is described herein. Like FIG. 2, controller 22 sends commands initializing IOs in a serial sequence to each memory die 36A-36D, and in each die, R/W unit 32 programs memory 34 at the corresponding tProg duration. After sending a command initializing IO 38D to die 36D, controller 22 sends a command initializing IO 38E to die 36A.

In the example of FIG. 2, the tP0 duration is shorter than the total duration of four IOs, resulting suspension period 44A in die 36A.

In the example of FIG. 3, controller 22 sends a third page, which takes longer to program into memory 34 of die 36A than a first page. R/W unit 32 programs this page in a duration tP2 46A (assumed herein to be 5 ms), which is longer than the sum of four IO durations (assumed herein to be 1.6 ms). Accordingly, a command initiating IO 38E sends a new first page (tP0 40A), which arrives at die 36A while R/W unit 32 is still programming the previous page (tP2 46A). As a result, this first page is queued to be programmed by the R/W unit, as soon as tP2 46A is completed, without any suspension. Controller 22 performs the same operation in die 36B, by initiating IOs 38B and 38F, and repeats the same operation in the remaining dies, 36C and 36D.

In some embodiments, if the programming time of a given die (e.g., tP1 2 ms or tP2 5 ms) is longer than the total IO duration for all the dies to be programmed (e.g., 0.4 ms times 4 dies, which equals 1.6 ms in the present example of four dies), the programming sequence does not have suspension periods, and hence, the pages may be programmed faster.

FIG. 4 is a timing diagram that schematically illustrates two programming cycles of TLC memory device 36A in a programmed array of four devices, in accordance with an embodiment that is described herein. FIG. 2 describes the full programming cycle in all four dies, while the description of FIG. 4 is based on FIG. 2, but focuses on the time scheme of R/W unit 32 in die 36A. The time scheme comprises IOs, tProgs, and suspension periods 44, which are marked along the time scheme. In a separate line above the time scheme, there are multiple blocks. Each block comprises three IO durations representing three pages sent by controller 22 to the other three dies in the array (e.g., die 36B-die 36D), while R/W unit 32 programs the stored page in memory 34 in die 36A.

As described for FIGS. 2 and 3, controller 22 sends commands initiating the IOs to dies 36B-36D, while R/W unit 32 programs the corresponding page into memory 34. The sequence of IOs in the time scheme of FIG. 4 shows the availability of controller 22 to send the next page to die 36A.

Furthermore, programming cycles 50 and 52 represent two different programming cycles. Each cycle comprises programming of three pages into a word line of TLC device 36A, and the corresponding IOs, tProgs and suspension periods. The sequences of cycles 50 and 52 start with programming the second page, followed by the third page, and finally the first page as will be detailed below. A typical order of the programming cycles should be programming the first page, the second page and the third page in order, but the above order was selected to show cycle time differences between cycles 50 and 52.

Controller 22 sends a first page to die 36A during IO 38A. R/W unit 32 programs this page during tP0 40A, which is shorter than the total duration of the four IOs to the four respective dies in this programmed array, and thus results in a suspension period 44A. Subsequently, at the beginning of cycle 50, controller 22 sends a second page during IO 38E, and R/W unit 32 programs this page during tP1 42A, which is longer than the duration of the four IOs. In parallel, controller 22 sends a third page during IO 38I while R/W unit 32 still programs the second page during tP1 42A. The third page will be programmed by R/W unit 32 without any suspension.

After programming the second page during tP1 42A, R/W unit 32 immediately starts programming the third page tP2 46A that was sent during IO 38I. The programming duration of tP2 46A is significantly longer than the total duration of the four IOs, and in parallel, controller 22 sends a third page to the other three dies in the array (marked by three IO blocks above tP2 46A), one after the other, as described in FIG. 2.

After sending the third page to all four dies, controller 22 completes programming cycle 50, which comprises storing three pages to each of the four dies (denoted die 36A-die 36D). Subsequently, controller 22 starts a second programming cycle 52 by sending a page during IO 38M to die 36A, while R/W 32 is still programming die 36A during tP2 46A.

After completion of tP2 46A, R/W unit 32 immediately starts programming the next page during tP0 40A while controller 22 sends a command initiating IO 38P to die 36A. As soon as R/W unit 32 completes programming the first page during tP0 40A, it can immediately start programming the second page during tP1 42A. Similarly, controller 22 sends a third page during IO 38E, to die 36A while R/W unit 32 is programming the second page during tP1 42A, and thus, R/W 32 can start programming the third page during tP2 46A without any suspension.

In some embodiments the technique described above shortens the total programming cycle time of the three pages to each of the four dies. For example, a programming cycle of three pages in one die (in an array of four dies), may comprise the following sequence:

A first page is sent by controller 22 to die 36A, R/W unit 32 programs the page to memory 34 and waits for a second page. This operation repeats at all three pages and this serial operation dictates a total cycle time of multiple IOs (depending on the duration of IO with respect to programming duration and the programming time of each page).

In another embodiment part of the programming process can run in parallel with pages sent by the controller. Cycle 50 illustrates a parallel programming operation of the third page. Controller 22 sends the third page during IO 38I while R/W unit 32 still programs the second page, so there is no suspension period between the programming time of the second page (tP1 42A) and the programming time of the third page (tP2 46A).

In an alternative embodiment, the entire cycle can run in parallel. Cycle 52 illustrates a parallel process in which R/W unit 32 programs page by page without suspensions between the pages. As shown in FIG. 4, cycle 52 is shorter than cycle 50 by the duration of one IO (38E), and one suspension period 44A. According to the example of FIG. 2, the duration of each IO is 0.4 ms and the typical duration of suspension period 44A is 1.1 ms. Therefore in total, cycle 52 is shorter than cycle 50 by 1.5 ms. Note that the next page after cycle 52, sent by controller 22 during IO 38M and waiting to be programmed by R/W unit 32 (during tP0 42A), and thus, R/W unit programs continuously without any suspension period between tP0 40A and the next page (tProg1).

Typically, system 20 requires suspension periods between programming operations, for other activities such as reading. In some embodiments controller 22 optimizes the cycle time of system 20 by setting the breaks after the shortest programming time (e.g., tP0 40A) and uses the suspension period for other activities. For example, in FIG. 4, suspension period 44A may be used as a break for reading operations by R/W unit 32.

Figure 5A:
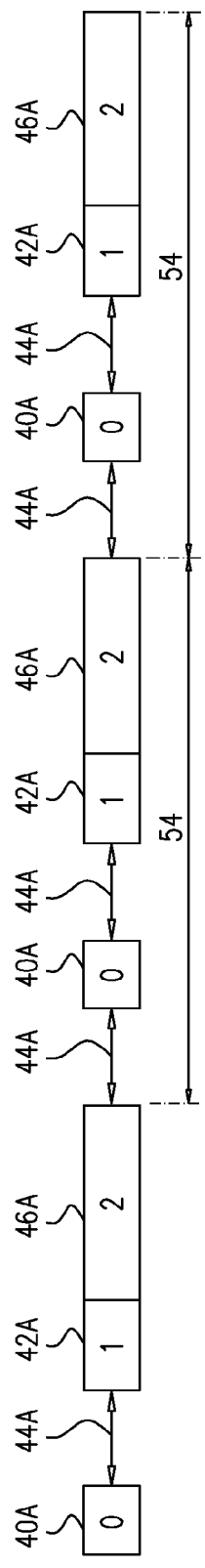
FIGS. 5A and 5B are timing diagrams that schematically illustrate programming cycles in a read/write (R/W) unit of a TLC memory device, in accordance with an embodiment that is described herein.
Figure 5B:
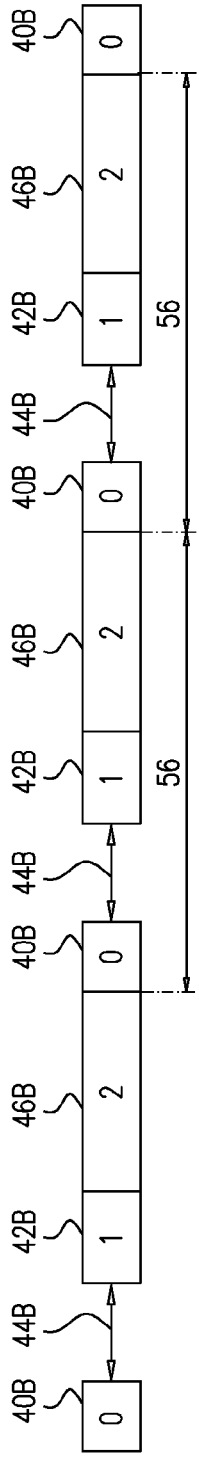

FIGS. 5A and 5B are based on FIGS. 2-4 and use the same elements (and the same identifiers). Furthermore, FIGS. 5A and 5B illustrate only the programming durations (denoted tProg) in die 36A (in FIG. 5A) and die 36B (in FIG. 5B).

FIG. 5A is a timing diagram that schematically illustrates programming cycles 54 in R/W unit 32 of die 36A, in accordance with an embodiment that is described herein. The numbers in FIGS. 5A and 5B represent programming durations by R/W unit 32. For example, "0" represents "tP0" (duration of a first page), and "2" represents "tP2" (duration of a third page). Suspension period 44A represents a period where R/W unit 32 does not program into memory 34.

Programming cycle 54 begins after the third page of the previous cycle is programmed, e.g., after tP2 46A. In the example of FIG. 5A cycle 54 begins with suspension period 44A, which is forced since controller 22 is distributing pages to the other three memory devices (e.g., 36B-36D) in the array, as described in FIGS. 2-4. As soon as controller 22 sends the first page, R/W unit 32 resumes programming at the beginning of tP0 40A (labeled "0"). As described in FIGS. 2-4, controller 22 sends the first page to the other three dies, 36B-36D, while the R/W unit is programming the first page during tP0 40A. R/W unit 32 completes tP0 40A before controller 22 sends the first page to each of dies 36B-36D, and thus, waiting for the second page during suspension period 44A.

Controller 22 completes sending the first page to dies 36B-36D and then sends the second page to die 36A. R/W unit 32 receives the second page and programs it during tP1 42A (labeled "1"). Since the duration of tP1 42A is longer than the sum of four IO durations (for the corresponding dies 36A-36D shown in FIG. 2), controller 22 completes sending the second page to all four dies and can send the third page to R/W unit 32 before the R/W unit completes programming tP1 42A. As a result, R/W unit 32 may start programming the third page during tP2 46A (labeled "2") immediately after completion of programming duration tP1 42A.

After the third page, which is the last page of programming cycle 54, controller 22 holds delivery of a new page to enable suspension period 44A. A second cycle 54 starts with tP0 40A, and repeats an identical sequence as in the first cycle.

In this example, each cycle 54 comprises two suspension periods 44A.

FIG. 5B is a timing diagram that schematically illustrates programming cycles 56 in R/W unit 32 of die 36B, in accordance with an embodiment that is described herein.

Programming cycle 56 begins after the third page of the previous cycle is programmed, e.g., after tP2 46B. Unlike cycle 54 in FIG. 5A, which starts with suspension period 44, programming cycle 56 starts with R/W unit 32 programming the first page during tP0 40B (labeled "0"), followed by suspension period 44B, and subsequently, unit 32 programs the second page during tP1 42B followed by the third page during tP2 46B. The next programming cycle 56 starts immediately with the first page during tP0 40B, without suspension period 44B, and the same sequence repeats in all the remaining steps of cycle 56.

In some embodiments, in FIGS. 5A and 5B cycle 56 has a single suspension period 44B, while cycle 54 has two suspension periods 44A, due to the forced suspension period 44A after tP2 46A. This difference makes cycle 56 shorter than cycle 54 by 1.1 ms. In other embodiments controller 22 may initiate additional suspension periods for reading or other operations in die 36A or any other die among dies 36B-36D. In yet other embodiments, R/W unit 32 may program all three pages (one by one) continuously without any suspension, as described in cycle 52 at FIG. 4.

It will be appreciated that the embodiments described above are cited by way of example, and that the present disclosure is not limited to what has been particularly shown and described hereinabove. Rather, the scope of the present disclosure includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. Apparatus comprising:
an interface, which is configured to communicate with a memory device; and
a processor, which is configured to send to the memory device, via the interface, a sequence of write commands that program multiple types of memory pages that incur respective different programming durations in the memory device, while inserting, in the sequence, suspension periods for permitting execution of storage commands that are not part of the sequence, such that at least some of the suspension periods are followed by write commands of types that do not have a shortest programming duration among the programming durations.

2. The apparatus according to claim 1, wherein the processor is configured to execute, during the suspension periods, at least one storage command that is not part of the sequence.

3. The apparatus according to claim 2, wherein the interface is configured to communicate with one or more additional memory devices, and wherein the processor is configured to execute the storage command that is not part of the sequence in the additional memory devices.

4. The apparatus according to claim 2, wherein the storage command that is not part of the sequence comprises a read command.

5. The apparatus according to claim 1, wherein the multiple types comprise a Least Significant Bit (LSB) page type and at least one additional page type, and wherein the processor is configured to insert at least some of the suspension periods before write commands of the additional page type.

6. The apparatus according to claim 1, wherein the processor is configured to send the write commands in a cache programming mode.

7. A method, comprising:
sending to a memory device a sequence of write commands that program multiple types of memory pages that incur respective different programming durations in the memory device; and
inserting, in the sequence, suspension periods for permitting execution of storage commands that are not part of the sequence, such that at least some of the suspension periods are followed by write commands of types that do not have a shortest programming duration among the programming durations.

8. The method according to claim 7, and comprising executing, during the suspension periods, at least one storage command that is not part of the sequence.

9. The method according to claim 8, wherein executing the storage command comprises performing the storage command that is not part of the sequence in one or more additional memory devices.

10. The method according to claim 8, wherein the storage command that is not part of the sequence comprises a read command.

11. The method according to claim 7, wherein the multiple types comprise a Least Significant Bit (LSB) page type and at least one additional page type, and wherein inserting the suspension periods comprises inserting at least some of the suspension periods before write commands of the additional page type.

12. The method according to claim 7, wherein sending the sequence comprises sending the write commands in a cache programming mode.

13. Apparatus comprising:
a memory device; and
a processor, which is configured to send to the memory device, via an interface, a sequence of write commands that program multiple types of memory pages that incur respective different programming durations in the memory device, while inserting, in the sequence, suspension periods for permitting execution of storage commands that are not part of the sequence, such that at least some of the suspension periods are followed by write commands of types that do not have a shortest programming duration among the programming durations.

14. The apparatus according to claim 13, wherein the processor is configured to execute, during the suspension periods, at least one storage command that is not part of the sequence.

15. The apparatus according to claim 14, wherein the processor is configured to execute the storage command that is not part of the sequence in one or more additional memory devices.

16. The apparatus according to claim 14, wherein the storage command that is not part of the sequence comprises a read command.

17. The apparatus according to claim 13, wherein the multiple types comprise a Least Significant Bit (LSB) page type and at least one additional page type, and wherein the processor is configured to insert at least some of the suspension periods before write commands of the additional page type.

18. The apparatus according to claim 13, wherein the processor is configured to send the write commands in a cache programming mode.

* * * * *